United States Patent
Nakai et al.

(10) Patent No.: US 6,946,091 B2
(45) Date of Patent: Sep. 20, 2005

(54) LASER DRILLING

(75) Inventors: Izuru Nakai, Toyonaka (JP);
Toshiharu Okada, Ibaraki (JP);
Haruhiro Yuki, Minoo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/881,769

(22) Filed: Jun. 18, 2001

(65) Prior Publication Data

US 2001/0052659 A1 Dec. 20, 2001

(30) Foreign Application Priority Data

Jun. 16, 2000 (JP) ........................................ 2000-181085

(51) Int. Cl.⁷ .............................................. B23K 26/38
(52) U.S. Cl. .................. 264/400; 264/482; 219/121.69; 219/121.71; 219/121.72; 219/121.83
(58) Field of Search ....................... 219/121.61, 121.62, 219/121.83, 121.68, 121.69, 121.71, 121.72, 121.7; 264/482, 490

(56) References Cited

U.S. PATENT DOCUMENTS

| | | | | |
|---|---|---|---|---|
| 4,839,497 A | * | 6/1989 | Sankar et al. .......... | 219/121.71 |
| 5,741,456 A | * | 4/1998 | Ayrton ....................... | 264/400 |
| 5,841,099 A | * | 11/1998 | Owen et al. ........... | 219/121.69 |
| 5,969,335 A | | 10/1999 | Karasaki | |
| 6,103,992 A | * | 8/2000 | Noddin .................. | 219/121.71 |
| 6,228,311 B1 | * | 5/2001 | Temple et al. .............. | 264/400 |
| 6,281,471 B1 | * | 8/2001 | Smart .................... | 219/121.62 |
| 6,407,363 B2 | * | 6/2002 | Dunsky et al. ........ | 219/121.71 |
| 6,437,283 B1 | * | 8/2002 | Wiggermann et al. ... | 219/121.7 |

FOREIGN PATENT DOCUMENTS

WO    WO 86/02301    * 4/1986

* cited by examiner

Primary Examiner—Stefan Staicovici
(74) Attorney, Agent, or Firm—Greenblum & Bernstein, P.L.C.

(57) ABSTRACT

When drilling a multi layered sheet-like material, drilling is first made with pulses having energy that generates an inter-layer pull-off force smaller than the adhesion force between the layers. Then pulses with higher energy are radiated for trimming the shape of the holes, and thus through-holes having a desired shape are drilled without causing delamination of the layers.

3 Claims, 4 Drawing Sheets

LASER DRILLING

The present disclosure relates to subject matter contained in priority Japanese Patent Application No. 2000-181085, filed on Jun. 16, 2000, the contents of which is herein expressly incorporated by reference in its entirety.

BACKGROUND OF THE INVENTION

1. Field of the Invention

The present invention relates to laser drilling of sheet-like materials for printed substrates, and more particularly, to a laser drilling method and apparatus for forming through-holes in multi layered sheet-like materials.

2. Description of Related Art

Known laser drilling methods for sheet-like materials are the single pulse processing method, and the burst pulse laser train method that performs processing by multiple pulses of which each pulse has the same energy level. In these known methods, the shape of a hole is determined by a level of energy per pulse used for the processing, and when a hole with reduced taper is desired, a higher energy level per pulse is required.

In drilling a multi layered sheet-like material, however, when pulses with energy above a certain level are radiated on the sheet-like material where there are holes not yet through, pressure in the holes increases to a level greater than inter-layer adhesion force Fm. When the pressure increases in the hole before the holes have been completely through, delamination of the layers occur in the sheet-like material. As a result, clearances are produced between the layers, and when filling with electrically conductive paste this leads to seeping of the paste, into between the layers. This together with poor quality in plating results in lower reliability in electrical connection.

SUMMARY OF THE INVENTION

In light of the foregoing problems of the prior art, an object of the present invention is to provide a method and apparatus for laser drilling without causing delamination of the layers, so that electrical connection between the layers sheet-like materials is secured.

To achieve the object, the invention provides a method and apparatus, in which, when drilling a multi layered sheet-like material, holes are first drilled through by laser pulses having energy that generates an inter-layer pull-off force which is smaller than the inter-layer adhesion force. Also, in the trimming process that shapes the holes, the holes themselves serve as escape passages for gasses produced during the radiation of high energy laser pulses, and act to suppress pressure increase in the holes, preventing delamination of the layers from occurring.

While novel features of the invention are set forth in the preceding, the invention, both as to organization and content, can be further understood and appreciated, along with other objects and features thereof, from the following detailed description and examples when taken in conjunction with the attached drawings.

DESCRIPTION OF THE PREFERRED EMBODIMENTS

Figure 1:
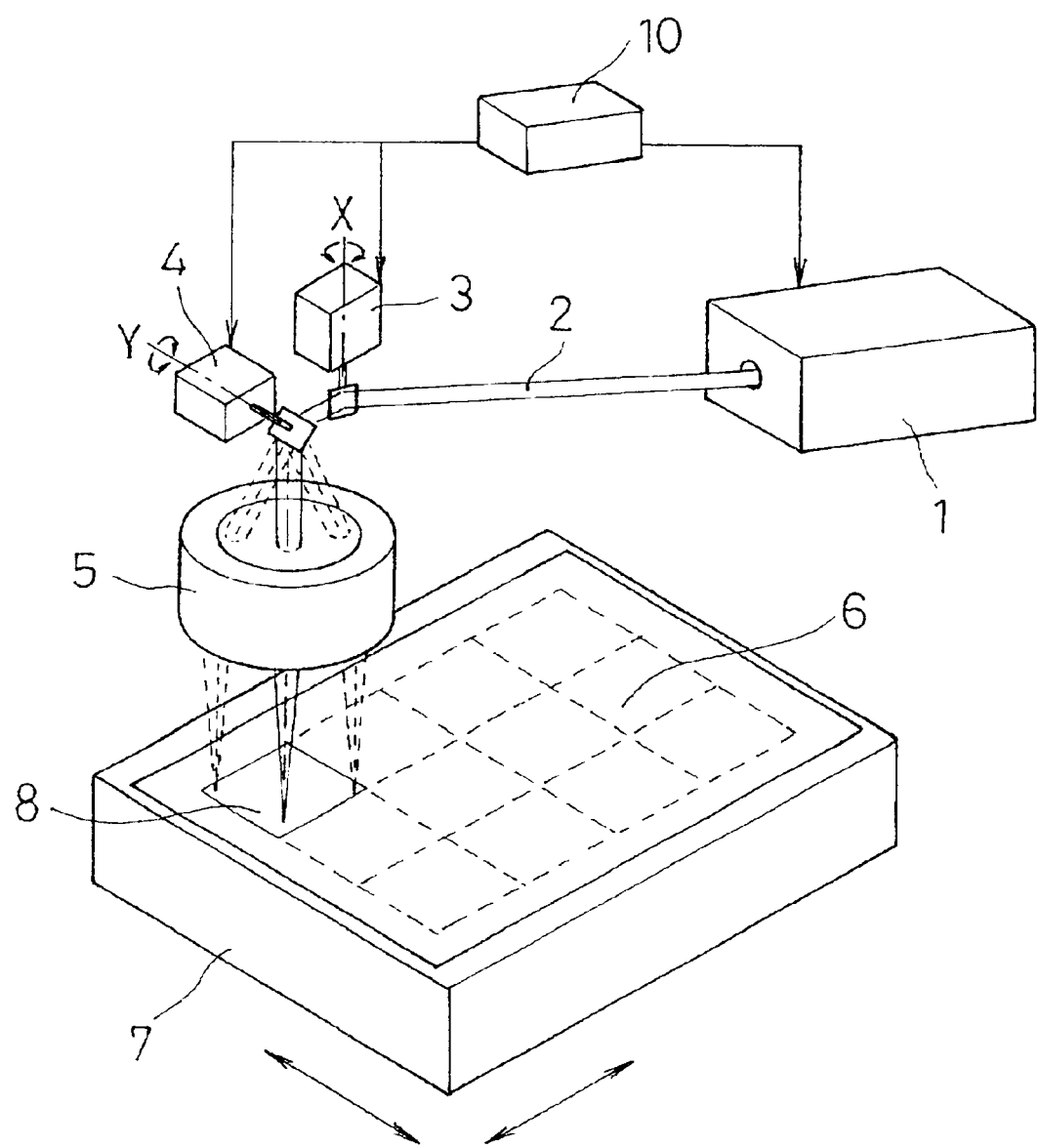
FIG. 1 is a schematic view of a laser drilling apparatus of the present invention.

FIG. 1 shows a laser drilling apparatus according to one embodiment of the present invention, the apparatus used for drilling sheet-like materials. A sheet-like material has three layers, and is formed such that a sheet made of polyethylene terephthalate is fused on both sides of a substrate, which is made of non-woven alamide cloth impregnated with epoxy resin. A laser beam 2 radiated from a laser oscillator 1 is positioned at a desired position within an area 8 (50×50 mm in size) by galvano mirrors 3, 4. Also, the laser beam 2, pulse-oscillated by a control device 10 in synchronism with the positioning operation, is converged on the surface of a sheet-like material 6 through fθ lens 5. Here, the laser beam 2 is converged on the sheet-like material 6 at a right angle to its surface. As soon as the processing in the area 8 is completed, the sheet-like material 6 is moved by an X-Y table 7 and an area adjacent to the processed area 8 is processed. Repeating the operation described above completes the processing of the entire surface of the sheet-like material 6.

Figure 2A:
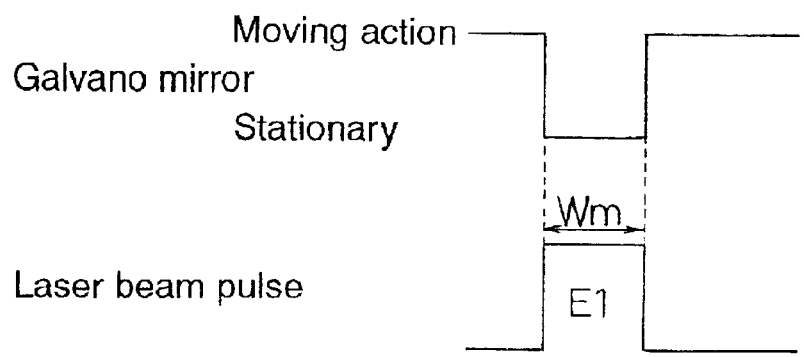
FIGS. 2A–2C are drawings explaining operation of the Laser drilling method and apparatus of the invention.
Figure 2B:
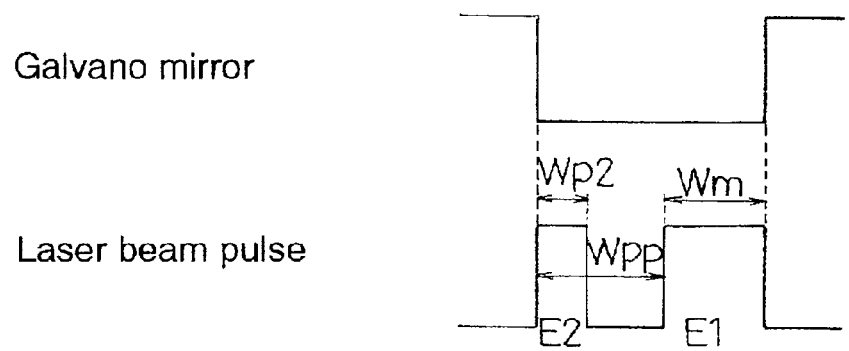
Figure 2C:
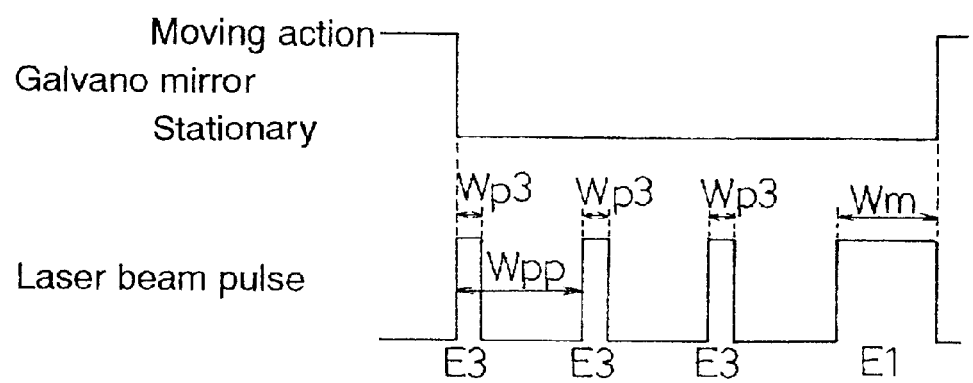
Figure 3A:
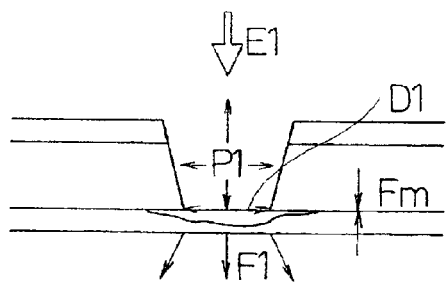
FIGS. 3A–3C are cross sectional views of a hole being processed by the laser drilling method and apparatus.
Figure 3B:
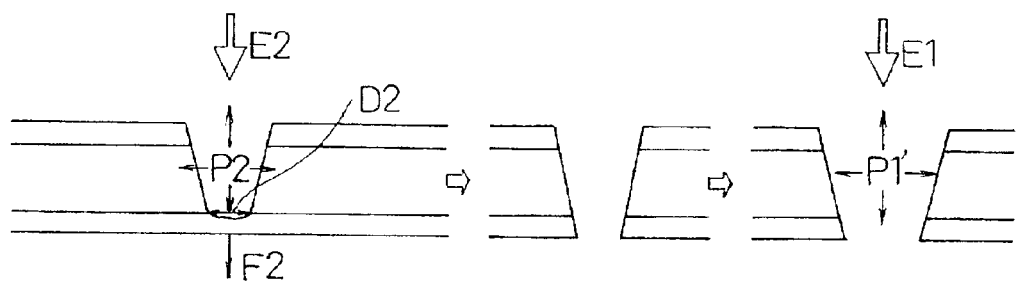
Figure 3C:
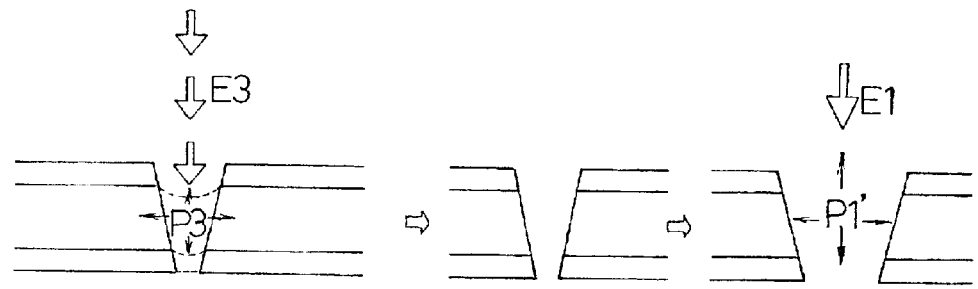

FIGS. 2A–2C show the movement of the galvano mirrors 3, 4 and operation of laser beam pulses. The laser beam pulses are emitted for drilling when the galvano mirrors have been positioned and are stationary. FIGS. 3A–3C are schematic sectional views of the condition of drilled holes, each of which corresponds to each laser beam pulse condition indicated in FIGS. 2A–2C. In a conventional processing method, as shown in FIG. 2A, when drilling holes with diameters of φ 150–200 μm in a sheet-like material with thickness t of 130–150 μm, pulses with energy E1 (25–35 mJ/p) high enough to drill through-holes in the sheet-like material 6 are radiated. As shown in FIG. 3A, a pressure P1 in a hole under the drilling process increases accordingly, which gives an equation as below showing the relationship between the inter-layer pull-off force F1 and the inter-layer adhesion force Fm, resulting in delamination of the layers.

$$F1(\propto P1 \times D1^2) > Fm, \qquad \text{[Equation 1]}$$

where
F1=inter-layer pull-off force,
P1=pressure in the hole,
D1=hole diameter,
Fm=inter-layer adhesion force.
D1 is the hole diameter shown in FIG. 3A.

Next, as shown in FIG. 2B, pulse energy E2 (<E1) is set at an energy level (approximately 5–7 mJ/p) that can drill through-holes with a single laser pulse while generating an inter-layer pull-off force that is smaller than the inter-layer adhesion force. The relationship between the inter-layer pull-off force F2 that depends on the pressure P2 in a hole being drilled and inter-layer adhesion force Fm is expressed as below.

$$F2(\propto P2 \times D2^2) < Fm, \qquad \text{[Equation 2]}$$

where
F2=inter-layer pull-off force
P2=pressure in the hole
D2=hole diameter
D2 is the hole diameter shown in FIG. 3B. Thus D2<D1 is obtained by lowering the pulse energy, and a through-hole having a diameter smaller than aimed is made. Then, pulses with the pulse energy E1 are radiated to trim the shape of the through-hole, but the pressure P1' in the hole does not act to pull off the layers, since the hole is already through, so that the occurrence of delamination of the layers is prevented. An interval Wpp between pulses for drilling through-holes and pulses for trimming the shape of the through-holes is set at 200 µs considering the influence from residual pressure in the holes.

FIG. 2C shows a drilling method where energy required for drilling with a single laser pulse creates an inter-layer pull-off force which is larger than the inter-layer adhesion force. Through-holes are drilled by radiating multiple pulses having lowered pulse energy E3 per single pulse in order to avoid the occurrence of delamination of the layers. Here the energy E3 per pulse is approximately 1–2 mJ/p and the pressure in the hole is P3. It is preferable to employ the burst pulse laser train method for the multiple radiations rather than cyclic processing, in order to reduce the processing time. In this case, however, the interval must be 200 µs or longer, because radiation where the intervals between pulse trains are too short brings about the same effect as the case when high energy is radiated at once. After drilling the through holes, pulses (energy E1) for trimming the shape of the holes are radiated.

Figure 4A:
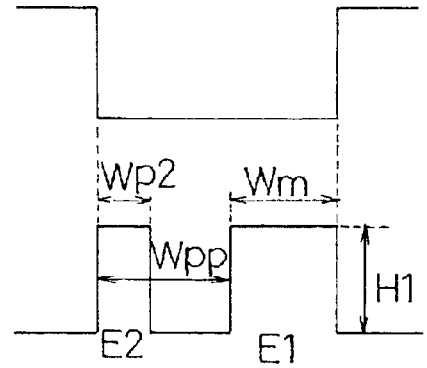
FIGS. 4A and 4B are drawings showing pulse trains with different methods of changing pulse-energy.
Figure 4B:
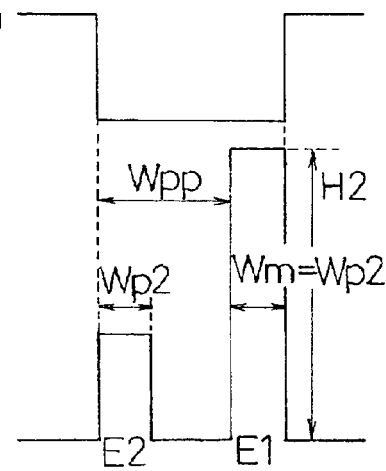
Figure 5:
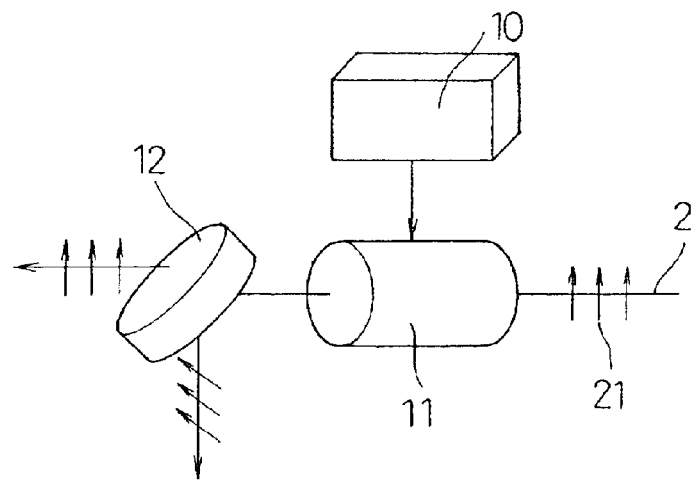
FIG. 5 is an explanatory drawing showing a method of changing a pulse-peak according to the invention.

FIGS. 4A and 4B are explanatory drawings showing different operational pulse energy levels. In $CO_2$ laser oscillators, laser peak power is almost constant for the power outputted for a pulse in an order of µs. Consequently, as shown in FIG. 4A, pulse energy is controlled by controlling the pulse width. FIG. 5 shows a pulse energy control method in a laser oscillator that radiates beams in the range from near infrared to near ultraviolet rays such as those of YAG lasers and their derivatives, higher harmonic lasers. Arrows 21 schematically indicate the directions of linear polarization. In this case, an E/O modulator (hereinafter, referred to as "EOM") is used to vary pulse energy by varying the laser peak power while maintaining a constant pulse width, as shown in FIG. 4B. More particularly, the peak strength of pulses coming through a polarizer 12 is controlled at a desired value by making the polarization angle of the laser beam 2 vary by instructions from the control device 10, which is achieved by making the laser beam 2 with linear polarization transmit through the EOM 11. This method is advantageous in that a pulse width is constant, processing is made free from the influence of the variation in the energy required for processing, and a processing time is constant.

In the laser drilling method and apparatus for drilling sheet-like materials according to the invention, through-holes are formed without causing delamination of the layers by first drilling with lower energy pulses that do not cause the delamination, and then the shape of the holes are trimmed with pulses having a higher energy.

Although the present invention has been fully described in connection with the preferred embodiment thereof, it is to be noted that various changes and modifications apparent to those skilled in the art to be understood as included within the scope of the present invention as defined by the appended claims unless they depart therefrom.

What is claimed is:

1. A method for laser drilling a hole in a multi-layered sheet-like material, the method comprising:

drilling through all layers of the material by at least one laser pulse having a first energy, which generates an inter-layer pull-off force smaller than an inter-layer adhesion force of the multi-layered sheet; and trimming a shape of the hole by at least one laser pulse having a second energy higher than the first energy, an interval between the at least one pulse having a first energy and the at least one pulse having a second energy being approximately 200 µS.

2. The method for laser drilling according to claim 1, further comprising controlling at least one of the first energy and the second energy by changing a laser pulse width.

3. The method for laser drilling according to claim 1, further comprising controlling at least one of the first energy and the second energy by changing a peak value.

* * * * *